United States Patent [19]

Akimov et al.

[11] 4,055,443
[45] Oct. 25, 1977

[54] METHOD FOR PRODUCING SEMICONDUCTOR MATRIX OF LIGHT-EMITTING ELEMENTS UTILIZING ION IMPLANTATION AND DIFFUSION HEATING

[76] Inventors: Jury Stepanovich Akimov, ulitsa Kosmonavtov, 4, kv. 30; Valery Petrovich Sushkov, ulitsa Onezhskaya, 45/19, kv. 123; Vladimir Ivanovich Kurinny, ulitsa Vavilova, 58, korpus 2, kv. 90, all of Moscow, U.S.S.R.

[21] Appl. No.: 588,465

[22] Filed: June 19, 1975

[51] Int. Cl.² .................. H01L 21/265; H01L 21/324; H01L 21/76
[52] U.S. Cl. .................................... 148/1.5; 148/171; 148/187; 357/16; 357/17; 357/18; 357/48
[58] Field of Search ................ 148/187, 171, 1.5, 175; 357/16, 17, 18, 48

[56] References Cited

U.S. PATENT DOCUMENTS

| | | | |
|---|---|---|---|
| 3,733,561 | 5/1973 | Hayashi | 148/1.5 UX |
| 3,745,070 | 7/1973 | Yada et al. | 148/1.5 |
| 3,752,713 | 8/1973 | Sakuta et al. | 148/1.5 X |
| 3,912,556 | 10/1975 | Grenon et al. | 148/175 |
| 3,958,265 | 5/1976 | Charmakadze et al. | 357/17 |

OTHER PUBLICATIONS

Blum et al., "Formation of Integrated – Led's" I.B.M. Tech. Discl. Bull., vol. 15, No. 2, July 1972, pp. 441–442.
Wolfe et al. Eds. "Applied Solid State Science," vol. 1, 1969, Academic Press, pp. 138, 139 and 326–328.

*Primary Examiner*—L. Dewayne Rutledge
*Assistant Examiner*—W. G. Saba

[57] ABSTRACT

Disclosure is made of a method for producing a semiconductor array of light-emitting elements, whereby a mask is first applied onto an n-layer of an epitaxial structure consisting of a substrate GaAs of the p+-type of conductivity with layers $Ga_{1-x}Al_xAs$ of the p-type and $Ga_{1-y}Al_yAs$ of the n-type applied successively onto it, which layers form a light-emitting p-n junction. The mask is produced by applying a photoresist layer onto the n-layer with subsequent exposure and etching. This is followed by introducing into the n-type layer, through said mask, an acceptor addition by means of ion implantation. After this the photoresist layer is removed, and a layer of $SiO_2$ is applied onto the uncovered n-layer. After this diffusion heat treatment is carried out for a time and at a temperature sufficient to produce in the n-layer regions of the p-type of conductivity whose depth is at least equal to the thickness of the n-layer.

1 Claim, 4 Drawing Figures

METHOD FOR PRODUCING SEMICONDUCTOR MATRIX OF LIGHT-EMITTING ELEMENTS UTILIZING ION IMPLANTATION AND DIFFUSION HEATING

The present invention relates to manufacturing semiconductor devices and, more particularly, to methods for producing semiconductor arrays of light-emitting elements. The demand for highly effective semiconductor arrays is due to the development of means for representing digital, alphabetic and symbolic information on single-digit and multi-digit displays, illuminated boards and screens. Semiconductor matrices of light-emitting elements are indisputably advantageous over other types of matrices (liquid crystal and plasma cell matrices, etc.) because they are unique in being able to meet the most strigent requirements, including high efficiency, mechanical strength, switching speed, reliability, compatibility with silicon integrated circuits, and a broad working temperature range.

At present there is known a method for producing a semiconductor array of light-emitting elements on the basis of an epitaxial structure comprising a substrate GaAs of the n+-type of conductivity, onto which there is applied an n-type layer $GaAs_{1-x}P_x$, $Ga_{1-x}Al_xAs$ or GaP, by producing a mask from a dielectric coating on the surface of the n-type layer, introducing therethrough into the n-type layer an acceptor zinc mixture and carrying out diffusion burning at a temperature and for a time that are sufficient to produce local light-emitting p-n junctions.

In an array thus produced each light-emitting element has a structure of the h+-type of conductivity whose radiation is directed through the highly deped upper n-type layer, which results in substantial (theoretically, no less than 200 to 300 percent) radiation power losses due to the absorption in free holes. The foregoing array producing method does not make it possible to produce light-emitting elements with small linear dimensions on the structures n+GaAs - $nGa_{1-x}Al_xAs$ due to rapid diffusion of zinc close to the surface along the border between $Ga_{1-x}AlsAs$ and the dielectric coating; the difference between the linear dimensions of the light-emitting element and those of the original photomask is no less than 70 to 100 mu.

Likewise, this method does not make it possible to employ the most progressive and controllable methods of introducing acceptor zinc mixture by ion implantation, as the zinc ion implantation leads to the formation in the active area of the p-type of conductivity of additional radiation-less recombination centers which reduce the quantum efficiency of light-emitting elements.

There is also known a method for producing a semiconductor array of light-emitting elements using of the most effective epitaxial structure comprising a substrate GaAs of the p+-type of conductivity with successively applied onto it layers $Ga_{1-x}Al_xAs$ of the p-type and $Ga_{1-y}Al_yAs$ of the n-type, which make up a light-emitting junction, by means of etching the mesa-structures.

This method also has a number of disadvantages.

In an array produced with the aid of this method the p-n junction area is not protected. This method does not make it possible to have an enlarged contact area and produce mesa-structures with reproducible dimensions of less than 70 to 100 mu.

In addition, the latter method has disadvantages inherent in semiconductor instruments manufactured by using mesa technique in contrast to those manufactured by using planar technique.

The closest to the method of the present invention is a method for producing a semiconductor array of light-emitting elements on the basis of an epitaxial structure comprising a substrate GaAs of the p+-type of conductivity with successively applied onto it layers $Ga_{1-x}Al_xAs$ of the p-type and $Ga_{1-y}Al_yAs$ of the n-type which form a light-emitting p-n junction along which on the surface of the n-type layer there is produced a mask of $Al_2O_3$ through which there is introduced in a sealed ampoule an acceptor zinc mixture from the vapor phase and diffusion burning is carried out at a temperature (700° C) and for a time (2 hours) that are sufficient to produce in the n-type layer areas of the p-type of conductivity whose depth is equal to at least the thickness of the n-layer.

This method makes it necessary to employ the mask of such a dielectric material ($Al_2O_3$) which is opaque for diffusing zinc atoms. This method does not make it possible to produce light-emitting elements with small linear dimensions, as, due to rapid zinc diffusion close to the surface along the border between $Ga_{1-y}Al_yAs$ and $Al_2O_3$, the difference between the linear dimensions of the light-emitting element and those of the original photomask is no less than 70 to 100 mu.

According to this method, the introduction of zinc atoms and the diffusion heat treatment are carried out in a sealed ampoule, which, on the one hand, considerably complicates the production process and, on the other, makes it impossible to reproduce the results as to the depth of zinc diffusion due to the fact that if it is impossible to reproduce the degree of vacuum and the pressure of arsenic vapors in the ampoule. Finally, in a light-emitting element matrix manufactured in accordance with this method the light-emitting elements are separated from one another by low-resistance $p+Ga_{1-y}Al_yAs$ spacings, which makes it impossible to produce enlarged ohmic contacts to the light-emitting elements or effect any interelectrode connections in the matrix.

Thus, the conventional methods of producing a semiconductor array of light-emitting elements on the basis of an epitaxial structure comprising a substrate GaAs of the p+-type of conductivity with successively applied onto it layers of $Ga_{1-y}Al_yAs$ of the p-type and $Ga_{1-y}Al_yAs$ of the n-type, which form a light-emitting p-n junction, does not make it possible to produce light-emitting elements with linear dimensions of less than 70 to 100 mu. In addition, these methods necessitate the use of the dielectric coating $Al_2O_3$, which complicates the manufacturing process; they also necessitate the introduction and diffusion of zinc in a sealed ampoule and do not make it possible to produce enlarged ohmic contacts to light-emitting elements and effect any inter-element connections.

It is the main object of the present invention to provide a method for producing a semiconductor array of light-emitting elements on the basis of an epitaxial structure comprising a substrate GaAs of the p+-type of conductivity with successively applied onto it layers of $Ga_{1-x}Al_xAs$ of the p-type and $Ga_{1-y}Al_yAs$ of the n-type of conductivity, which form a light-emitting p-n junction, which would make it possible to produce light-emitting elements with linear dimensions less than 70 to 100 mu.

It is another object of the present invention to provide a method for producing an array of light-emitting elements which would dispense with technological complications resulting from the use of $Al_2O_3$ coating.

It is still another object of the present invention to provide a method which would make it unnecessary to carry out diffusion burning in a sealed ampoule.

It is yet another object of the present invention to provide a method for producing a semiconductor array of light-emitting elements which would make it possible to produce enlarged ohmic contacts to the light-emitting elements and make for any type of inter-element connections.

The foregoing and other objects of the present invention are attained by providing a semiconductor array of light-emitting elements on the basis of an epitaxial structure comprising a substrate GaAs of the p+-type of conductivity with successively applied onto it layers of $Ga_{1-x}Al_xAs$ of the p-type and $Ga_{1-y}Al_yAs$ of the n-type, which form a light-emitting p-n junction, by producing a mask on the surface of the n-layer, introducing into the n-type layer, through said mask, an acceptor addition and carrying out diffusion firing for a time and at a temperature sufficient to produce in the n-layer areas of the p-type of conductivity whose depth is at least equal to the thickness of the n-layer, in which method the mask is produced, in accordance with the invention, by applying onto the n-layer a photoresist layer with subsequent exposure and etching, the acceptor addition being introduced by means of ion implantation, the diffusion firing being preceeded by removing the photoresist layer and applying onto the n-type layer a layer of $SiO_2$.

The proposed method makes it possible to produce an array of light-emitting elements on the basis of an epitaxial structure comprising a substrate GaAs of the p+-type of conductivity with successively applied onto it layers of $Ga_{1-x}Al_xAs$ of the p-type and $Ga_{1-y}Al_yAs$ of the n-type, which form a light-emitting p-n junction with minimum linear dimensions of the elements in the order of 10 mu; the proposed method also makes it possible to carry out diffusion firing under a dielectric $SiO_2$ coating in an open-type furnace, produce enlarged ohmic contacts to the light-emitting elements and make any inter-element connections, as on the surface of the matrix is a solid dielectric layer. It should also be pointed out that ion implantation is utilized to its full advantage in the proposed method without causing any undesired effects like the formation of additional radiationless recombination centers, because implantation of the acceptor addition is performed in those areas of the matrix that are not light-emitting.

Other objects and advantages of the present invention will become more apparent from the following detailed description of a preferred embodiment thereof taken in conjunction with the accompanying drawings, wherein.

Figure 1:
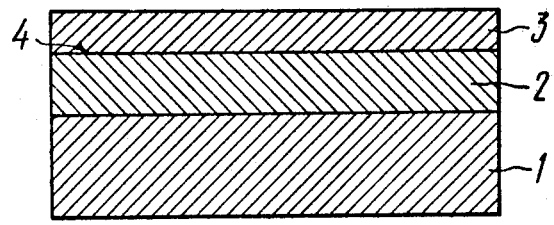
FIG. 1 is a longitudinal section of an original epitaxial structure.

Referring now to the attached drawings, the epitaxial structure shown in FIG. 1 comprises a substrate 1 of GaAs of p+-type conductivity with successively applied onto it layers 2 and 3, $Ga_{1-x}Al_xAs$ of the p-type and $Ga_{1-y}Al_yAs$ of the n-type, respectively, which form a light-emitting p-n junction 4.

Figure 2:
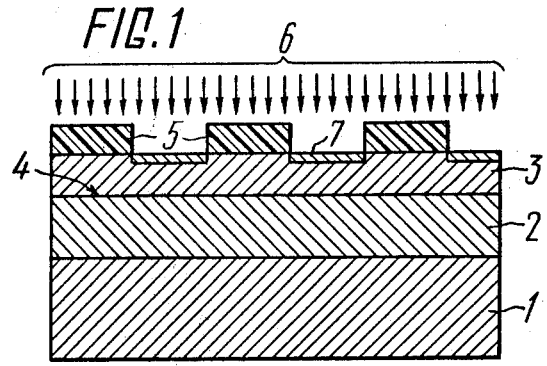
FIG. 2 shows the same after the application of a mask.

Unlike the epitaxial structure of FIG. 1, the epitaxial structure shown in FIG. 2 comprises a photoresist mask 5 applied onto the surface of the layer 3.

The arrows indicate an ion beam of an acceptor addition which may be zinc, beryllium or cadmium. Portions 7 located in the n-type layer 3 under windows in the mask 5 include an implanted acceptor addition.

Figure 3:
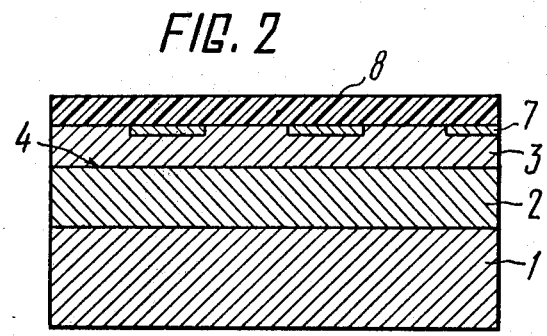
FIG. 3 shows the same after the application of a dielectric coating.

FIG. 3 shows the same structure after removing the photoresist mask 5 and applying onto the layer 3 a dielectric $SiO_2$ coating 8.

Figure 4:
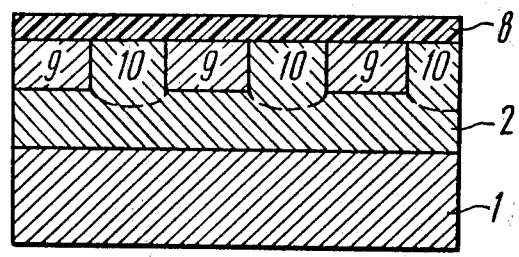
FIG. 4 is a longitudinal section of a semiconductor matrix of light-emitting elements.

In contrast in FIG. 3, FIG. 4 shows a semiconductor array of light-emitting elements 9 which includes, instead of the portions 7, areas 10 of the p-type of conductivity produced as a result of diffusion burning, the dotted lines indicating the lower limit of the penetration of an acceptor addition diffusing from the portions 7. The depth of this penetration is in excess of the thickness of the n-layer 3.

The proposed method is essentially carried out as follows. On the original epitaxial structure shown in FIG. 1 there is applied a photoresist layer. This layer is used to form, by means of exposure through a photomask and subsequent operations of hardening and etching, the mask 5 (FIG. 2) which protects areas corresponding to a preselected configuration and size of the light-emitting elements. The structure is then bombarded by an ion beam 6 of an acceptor addition, which process is carried out on an ion beam installation, the irradiation dose being in the order of $10^3$ to $10^4$ microcoulombs per $cm^{-2}$. This results in the formation of the portions 7 in the n-type layer 3, under windows in the mask 5, which portions 7 contain implanted acceptor addition. After the bombardment the photoresist mask 5 is removed by means of chemical or ion-plasm etching, which is followed by applying onto the uncovered n-type layer 3, in any known manner, the dielectric layer 8 (FIG. 3) of $SiO_2$. After this the structure is diffusion-burned in an open furnace in a hydrogen flow at a temperature of 750° to 900° C during 4 to 0.5 hours; as a result, there are formed in the layer 3 the areas 10 of the p-type of conductivity, whose depth is equal to or somewhat greater than the thickness of the n-type layer 3 to localize the light-emitting elements 9.

The invention will be better understood from the following specific example of an embodiment thereof.

EXAMPLE

The initial epitaxial structure comprises the substrate 1 (FIG. 1) GaAs of the p+-type conductivity with successively applied onto it the layers 2 and 3 of $Ga_{1-x}Al_xAs$ of the p-type and $Ga_{1-y}Al_yAs$ of the n-type, respectively, which form the p-n junction 4. The function of the substrate 1 GaAs of the p+-type of conductivity is performed by GaAs that are zinc-alloyed to a concentration of $(6 \div 8) \cdot 10^{18} cm^{-3}$, oriented in the plane (100) and optically polished on both sides. The layers 2 and 3 $Ga_{1-x}Al_xAs$ of the p-type and $Ga_{1-y}Al_yAs$ of the n-type, respectively, are applied by means of liquid-phase epitaxy from an arsenic-saturated gallium melt at a temperature of 950° C from a GaAs feeder. The p-type layer 2 is zinc-alloyed to a concentracion of $5 \cdot 10^{17} cm^{-3}$. The aluminum content (referred to as x in the formula of the compound) amounts to 35 at.%. The layer 3 is produced by counteralloying the same melt with n-type a tellurium addition in an amount sufficient to obtain an electron concentration of $(1 \div 2) \cdot 10^{18} cm^{-3}$. The aluminum content in the n-type layer 3 (referred to as y in the formula of the compound) amounts to 47 to 50 at.% due to additionally alloying the same melt with aluminum. The thickness of the layers 2 and 3 amounts to 20 and 3÷4 mu, respectively.

A positive photoresist layer is applied onto the initial epitaxial structure, which layer is based upon naphthoquinone diazide having a viscosity of 8 cs and a thickness of 4 to 5 mu.

This is followed by exposure through a photomask having dark areas with dimensions of 200 × 40 mu$^2$, and then by hardening and etching with a polish etchant containing 1 part of deionized water, 1 part of hydrogen peroxide, and 3 parts of sulfuric acid. Thus the photoresist mask 5 (FIG. 2) is produced which protects the initial structure portions having the size of 200 × 40 mu$^2$.

The structure is then bombarded with ions of an acceptor zinc addition by means of an ion-beam installation. In the course of bombardment the energy of the zinc atoms amounts to 40 keV; the irradiation dose amounts to 3·10$^3$ microcoulombs per cm$^{-2}$. The bombardment is carried out in vacuum at 10$^{-5}$ torrs.

The bombardment results in the formation of the portions 7 containing implanted zinc addition and having a depth of 0.2 mu.

After the bombardment the photoresist mask 5 is removed by chemical etching in a mixture of dioxan (1 part) and dimethyl formamide (1 part) heated to reach the boiling point.

On the uncovered n-type layer 3 there is applied the dielectric layer 8 (FIG. 3) of SiO$_2$ with a thickness of 0.34 mu, the application being effected by means of plasma sputtering of a quartz target.

The thickness of the dielectric layer 8 is selected to ensure transparency of the matrix on the luminescence wavelength.

After this the structure is subjected to diffusion firing in an open furnace in a hydrogen flow at a temperature of 800° C during 1.5 hours, i.e. under the conditions that are conducive to the formation in the layer 3 of the areas 10 (FIG. 4) of the p-type of conductivity which localize the light-emitting elements 9.

Then contact windows having the size of 120 × 10 mu$^2$ are photolithographically produced in the dielectric layer 8, in the centers of the light-emitting elements 9; this is followed by applying a two-layer ohmic contact by means of thermal sputtering to the layer 2 containing 88 percent of Au and 12 percent of Ge and having a thickness of 0.3 mu and to a 0.2 mu-thick layer of nickel, and the common ohmic contact containing 99 percent of Au and 1 percent of Zn is applied to GaAs of the p+-type of conductivity.

After photolithography contact strips with a size of 130 × 15 mu are left in the upper twp-layer contact coating, and the upper and lower ohmic contacts are fused-in in a flow of hydrogen.

In order to produce an enlarged ohmic contact, there is deposited on the structure of each light-emitting element 9 having a size convenient for ultrasonic welding of aluminum wire leads an aluminum layer; photolithography is then carried out with the use of a photomask to ensure a required size and location of the enlarged ohmic contacts.

The result of the process is a finished array of semiconductor light-emitting elements which meets all the requirements imposed upon a monolithic planex integrated circuit.

What is claimed is:

1. A method for producing a semiconductor array of light-emitting elements using an epitaxial structure consisting of a substrate GaAs of the p+-type of conductivity with layers of Ga$_{1-x}$Al$_x$As of the p-type and Ga$_{1-y}$Al$_y$As of the n-type of conductivity applied successively onto it, said layers forming a light-emitting p-n junction, comprising the steps of producing at first a photoresist mask on said n-type layer of said epitaxial structure, said mask protecting portions of said n-type layer which correspond to a required configuration and size of said light-emitting elements; introducing next an acceptor addition through said mask and said n-type layer by means of ion implantation, removing said photoresist mask; applying onto the uncovered n-type layer a layer of SiO$_2$; diffusion heating next for a time and at a temperature sufficient to produce in the n-type layer, under portions that were not protected by said mask, p-type areas whose depth is equal to at least the thickness of said n-type layer.

* * * * *